United States Patent
Asadi et al.

(10) Patent No.: US 11,881,869 B1
(45) Date of Patent: Jan. 23, 2024

(54) ASYMMETRIC BIT ERRORS IN LOW-DENSITY PARITY-CHECK CODES FOR NON-VOLATILE MEMORY DEVICES

(71) Applicant: SK hynix Inc., Icheon-si (KR)

(72) Inventors: Meysam Asadi, San Jose, CA (US); Fan Zhang, Fremont, CA (US); Seyhan Karakulak, San Jose, CA (US)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 17/957,974

(22) Filed: Sep. 30, 2022

(51) Int. Cl.
  *H03M 13/11* (2006.01)
  *H03M 13/00* (2006.01)

(52) U.S. Cl.
  CPC .... *H03M 13/1128* (2013.01); *H03M 13/1125* (2013.01); *H03M 13/1174* (2013.01); *H03M 13/616* (2013.01)

(58) Field of Classification Search
  CPC ...................... H03M 13/1128; H03M 13/1125
  See application file for complete search history.

(56) References Cited

U.S. PATENT DOCUMENTS

| | | | |
|---|---|---|---|
| 8,830,748 B2 | 9/2014 | Haratsch et al. | |
| 9,397,701 B1* | 7/2016 | Micheloni | H03M 13/612 |
| 9,563,502 B1* | 2/2017 | Alhussien | G11C 11/5642 |
| 10,944,424 B1* | 3/2021 | Wang | H04L 1/005 |
| 2017/0125114 A1* | 5/2017 | Alhussien | H03M 13/1108 |

\* cited by examiner

*Primary Examiner* — Joseph D Torres
(74) *Attorney, Agent, or Firm* — Perkins Coie LLP (57) ABSTRACT

Devices, systems, and methods for performance of an iterative decoder in a non-volatile memory are described. An example method includes receiving a noisy codeword that is based on a transmitted codeword generated from a low-density parity-check (LDPC) code, partitioning a maximum number of iterations of the iterative decoder into a plurality of stages, initializing a set of log likelihood ratios (LLRs) with symmetric LLRs, for each stage of the plurality of stages: performing a message passing algorithm, determining, at a last iteration of the current stage, a hard decision corresponding to a candidate version of the transmitted codeword, determining, based on the hard decision, a set of asymmetric LLRs, and assigning the set of asymmetric LLRs to the set of LLRs, and determining the candidate version of the transmitted codeword using the set of LLRs.

20 Claims, 11 Drawing Sheets

ASYMMETRIC BIT ERRORS IN LOW-DENSITY PARITY-CHECK CODES FOR NON-VOLATILE MEMORY DEVICES

TECHNICAL FIELD

This patent document generally relates to non-volatile memory devices, and more specifically, to low-density parity-check codes used in non-volatile memory devices.

BACKGROUND

Data integrity is an important feature for any data storage device and data transmission. In solid state memory storage (e.g., NAND flash) devices, information is stored in a cell by different charge levels in a cell. During the write and read process, noise is introduced by program disturb and inter-cell interference charge leakage that causes the voltage level to drop over time, where the drop is proportional to the amount of charge stored as well as the number of program and erase (P/E) cycles a cell has experienced. Accounting for the voltage drop when determining the read voltage thresholds increases the longevity of memory devices.

SUMMARY

Embodiments of the disclosed technology relate to methods, systems, and devices that improve performance of a block of a memory device that uses a low-density parity check (LDPC) code. In an example, the performance of the memory device is improved by estimating and using asymmetric channel log likelihood ratios (LLRs) in the LDPC decoder, which improve decoder performance by an order of magnitude. The improved decoder can output an optimized read voltage thresholds that account for the degradation of the memory cells, thereby enabling the robust retrieval of information from various types of memory devices over the entire lifespan.

In one example, a method for improving performance of a memory device is described. The method includes receiving a noisy codeword that is based on a transmitted codeword generated from a low-density parity-check (LDPC) code, and configuring an iterative decoder for its processing. The iterative decoder is configured by partitioning a maximum number of iterations of the iterative decoder into a plurality of stages, and initializing a set of LLRs with symmetric LLRs. For each stage of the plurality of stages, the following operations are performed: (1) for each iteration of the first number of iterations and based on the set of LLRs, a message passing algorithm between a plurality of variable nodes and a plurality of check nodes that represent a parity matrix of the LDPC code is performed; (2) at a last iteration of the first number of iterations for the stage, a hard decision corresponding to a candidate version of the transmitted codeword is determined; (3) a set of asymmetric LLRs is determined based on the hard decision; and (4) the set of asymmetric LLRs is assigned to the set of LLRs. After these four operations are performed for each of the stages, the method includes determining the candidate version of the transmitted codeword using the set of LLRs.

In another example, the methods may be embodied in the form of an apparatus that includes a processor and a memory coupled to the processor.

In yet another example, the methods may be embodied in the form of processor-executable instructions and stored on a computer-readable program medium.

The subject matter described in this patent document can be implemented in specific ways that provide one or more of the following features.

DETAILED DESCRIPTION

Semiconductor memory devices may be volatile or nonvolatile. The volatile semiconductor memory devices perform read and write operations at high speeds, while contents stored therein may be lost at power-off. The nonvolatile semiconductor memory devices may retain contents stored therein even at power-off. The nonvolatile semiconductor memory devices may be used to store contents, which must be retained regardless of whether they are powered.

With an increase in a need for a large-capacity memory device, a multi-level cell (MLC) or multi-bit memory device storing multi-bit data per cell is becoming more common. However, memory cells in an MLC non-volatile memory device must have threshold voltages corresponding to four or more discriminable data states in a limited voltage window. For improvement of data integrity in non-volatile memory devices, the levels, and distributions of read voltages for discriminating the data states must be adjusted over the lifetime of the memory device to have optimal values during read operations and/or read attempts.

FIGS. 1-6 overview a non-volatile memory system (e.g., a flash-based memory, NAND flash) in which embodiments of the disclosed technology may be implemented.

Figure 1:
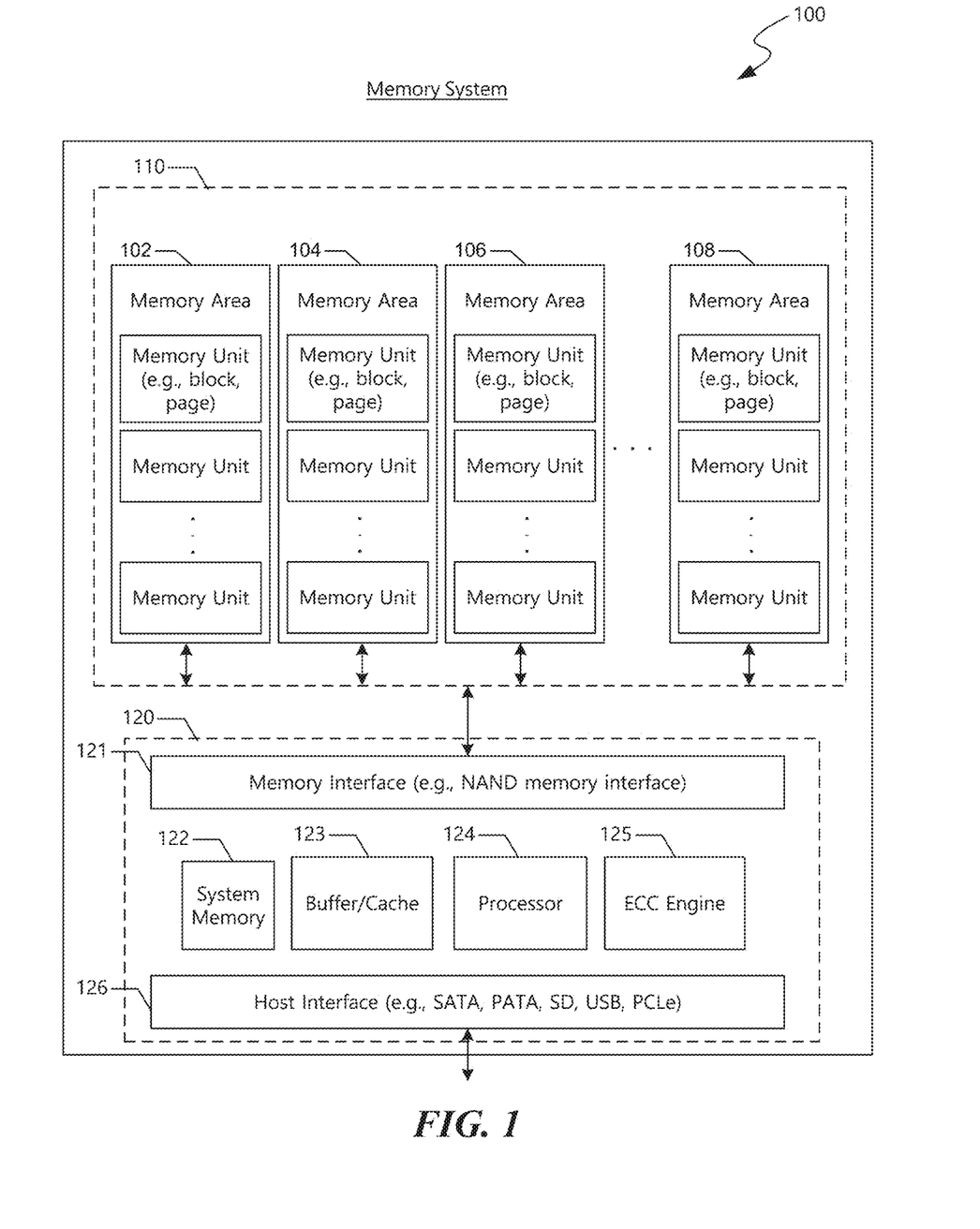
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, and 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a block or a page that can be identified by a unique address such as a block address or a page address, respectively. For another example, wherein the memory areas 102, 104, 106, and 108 can include computer memories that include memory banks as a logical unit of data storage, the memory unit can be a bank that can be identified by a bank address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change random-access memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 102, 104, 106, and 108 can be configured to store at least one bit of information (e.g., one bit of information or multiple bits of information), and each of the memory cells in memory area 102, 104, 106, and 108 can be configured to store more than one bit of information.

As shown in FIG. 1, the memory system 100 includes a controller module 120. The controller module 120 includes a memory interface 121 to communicate with the memory module 110, a host interface 126 to communicate with a host (not shown), a processor 124 to execute firmware-level code, and caches and memories 123 and 122, respectively to temporarily or persistently store executable firmware/instructions and associated information. In some implementations, the controller unit 120 can include an error correction engine 125 to perform error correction operation on information stored in the memory module 110. Error correction engine 125 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
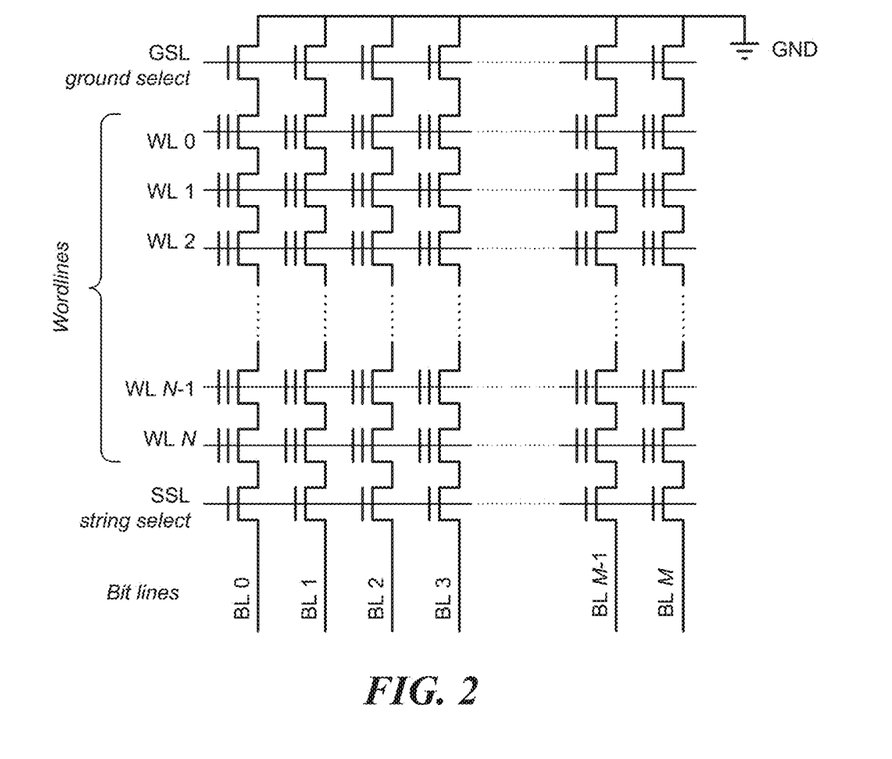
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
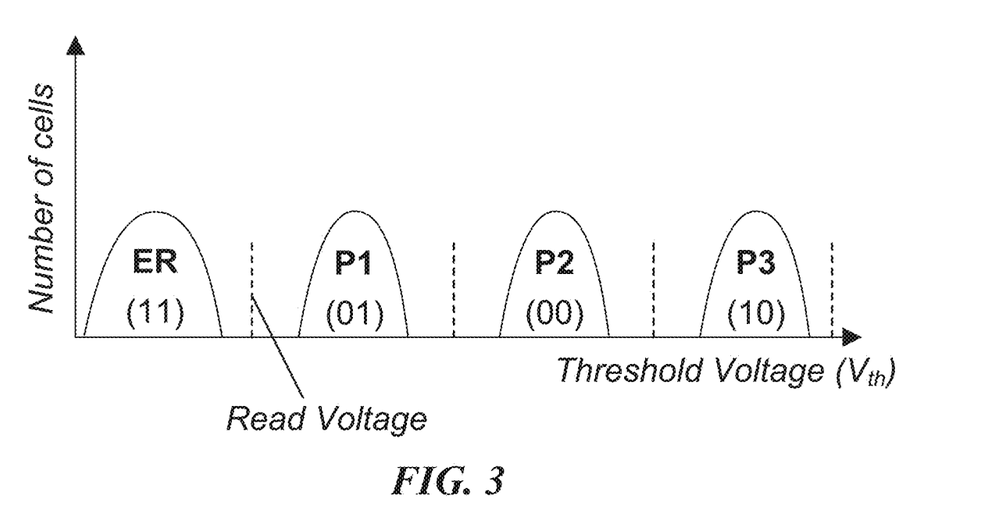
FIG. 3 is an example diagram illustrating the cell voltage level distribution ($V_{th}$) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

Although FIG. 3 shows a multi-level cell device by way of example, each of the memory cells can be configured to store any number of bits per cell. In some implementations, each of the memory cells can be configured as a single-level cell (SLC) to store one bit of information per cell, or as a triple-level cell (TLC) to store three bits of information per cell, or as a quad-level cells (QLC) to store four bits of information per cell.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a staircase program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECCO).

Figure 4:
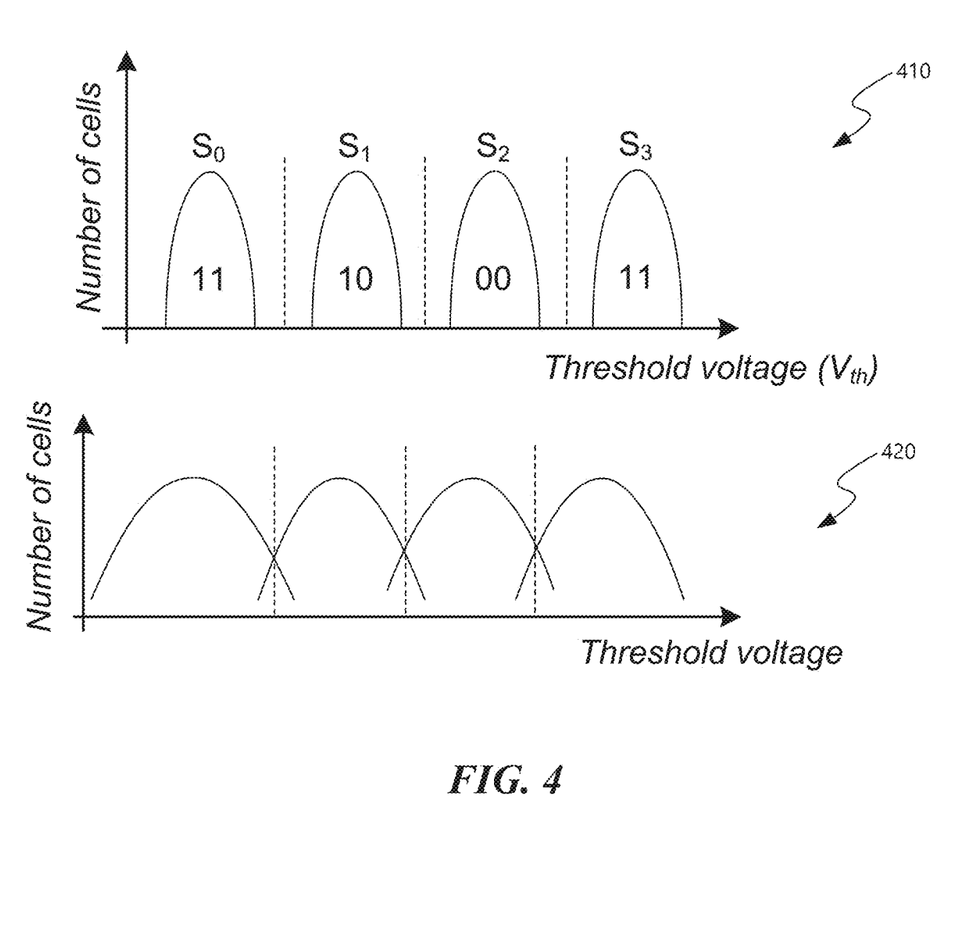
FIG. 4 is another example diagram illustrating the cell voltage level distribution ($V_{th}$) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
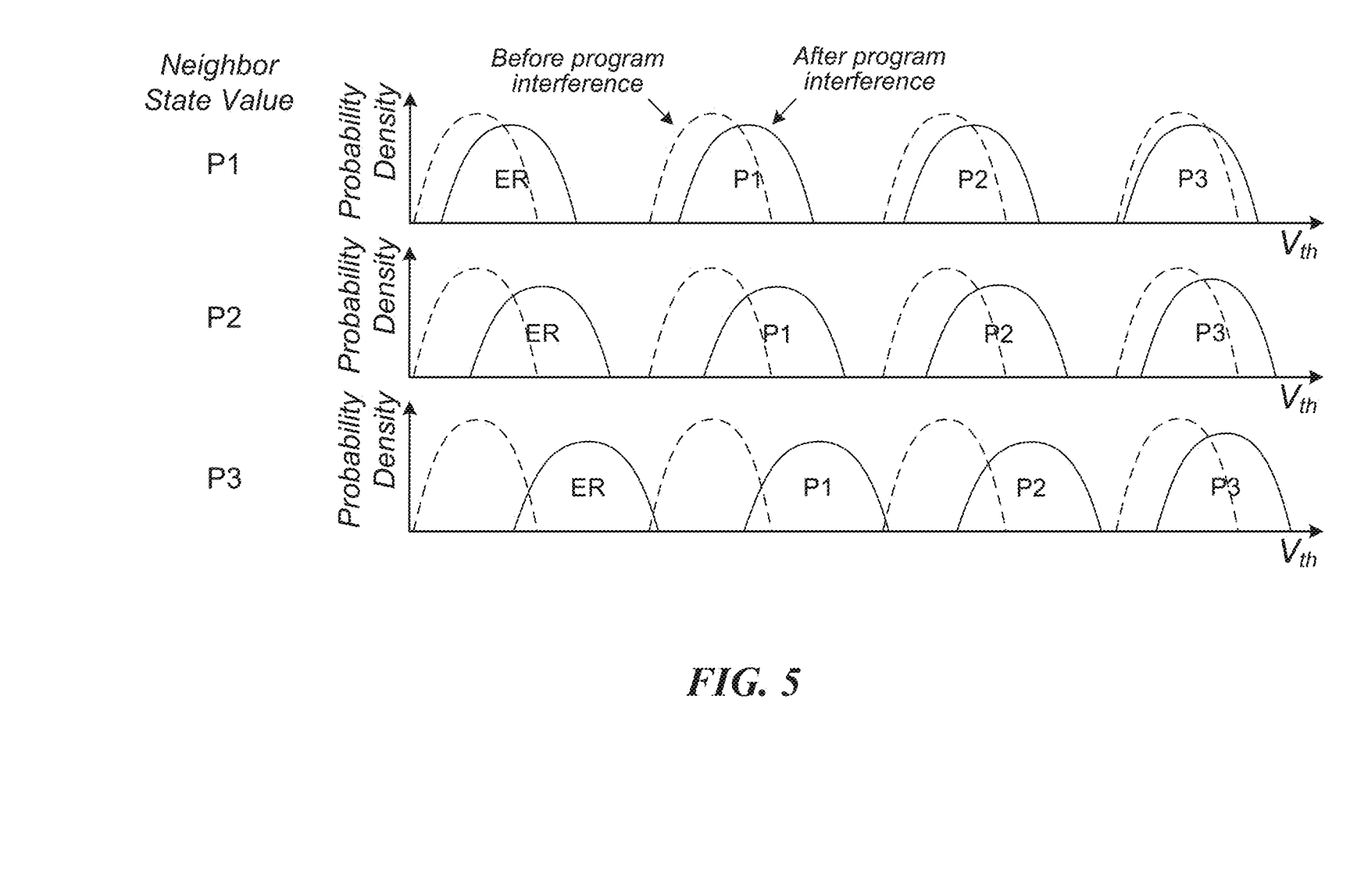
FIG. 5 is an example diagram illustrating the cell voltage level distribution ($V_{th}$) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell interference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
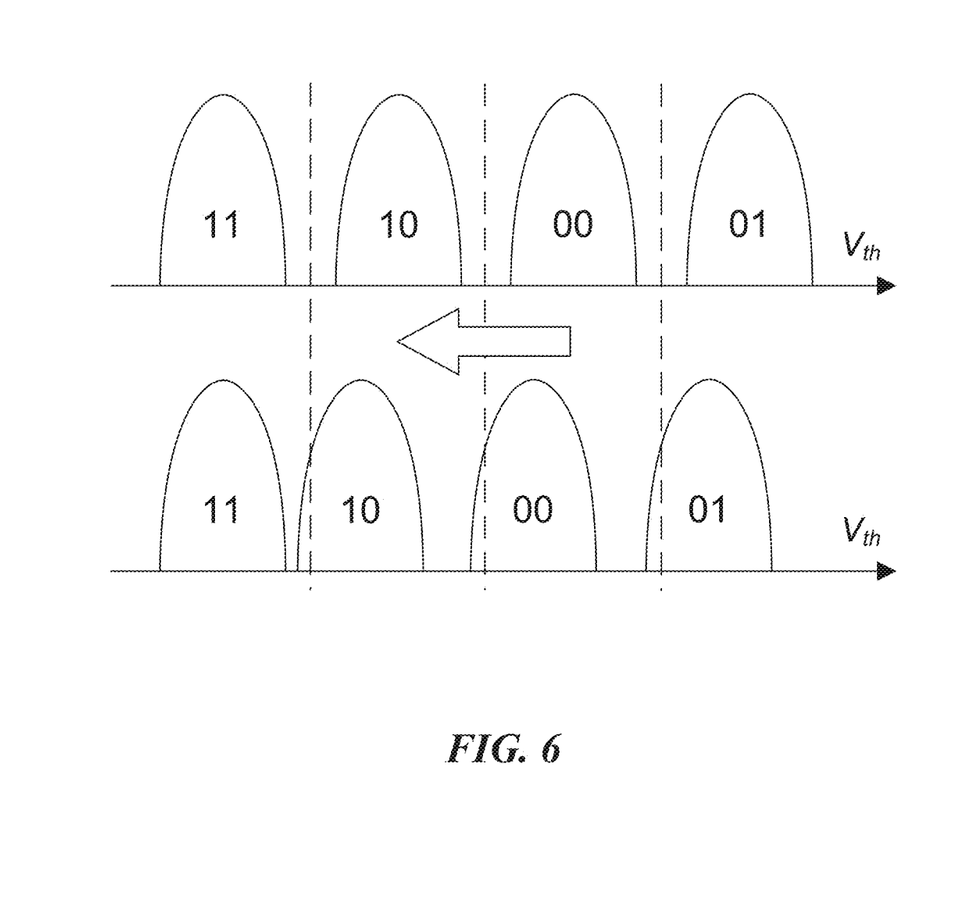
FIG. 6 is an example diagram illustrating the cell voltage level distribution ($V_{th}$) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

In NAND-based storage systems (e.g., the examples illustrated in FIGS. 1-6) and solid-state drive (SSD) applications, the performance of the LDPC decoder is typically tested for symmetric errors, which assumes that the model for the SSD read and write processes is the equivalent to transmitting a message over a binary symmetric channel (BSC). For example, if a NAND page is read using optimal thresholds voltages, the number of errors from "0" to "1" (denoted $BER_{0 \to 1}$) is nearly equal to the number of errors from "1" to "0" (denoted $BER_{1 \to 0}$). However, in practice, a NAND page is read using imperfect (or suboptimal) threshold voltages, which results in the asymmetric ratio $\alpha_r = BER_{0 \to 1} / BER_{1 \to 0}$ being much greater than, or much less than, one. This is equivalent to the SSD read/write processes being equivalent to transmitting messages through a binary asymmetric channel (BAC).

For each received bit, e.g., each bit read from a NAND page, the log likelihood ratio (LLR) is a real number that represents the likelihood of that received bit being zero-valued or being one-valued. By convention, a positive LLR is indicative of the bit being zero, whereas a negative LLR is indicative of the bit being one. In the case of a BSC (wherein the asymmetric ratio $\alpha_r$ is unknown), the channel LLRs for each bit are set equal to each other, and the decoder is denoted as being blind to the asymmetric ratio, and referred to as a blind decoder.

Figure 7:
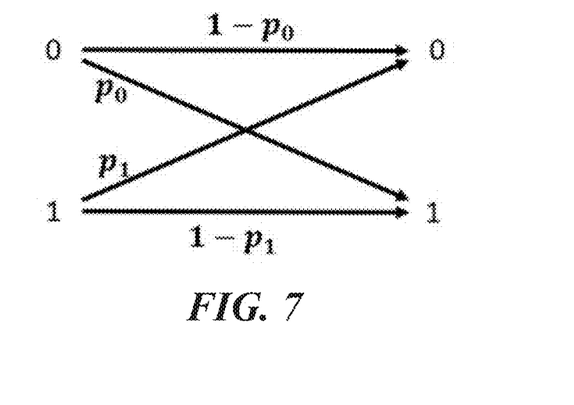
FIG. 7 illustrates an example of a binary asymmetric channel (BAC).

FIG. 7 shows an example of a BAC, where the probability of switching from 0 to 1 ($p_0$) is different from the probability of switching from 1 to 0 ($p_1$). The BSC is a special case of the BAC when $p_0 = p_1$. Let $l(z)$ denote the LLR that the recovered (or received) bit is z. If $p_0$ and $p_1$ are known to the decoder, the optimal computation of the channel LLR is determined as:

$$l(1) = \log\left(\frac{p(y=1|x=0)}{p(y=1|x=1)}\right) = \log\left(\frac{p_0}{1-p_1}\right) \quad (1)$$

and $$l(0) = \log\left(\frac{p(y=0|x=0)}{p(y=0|x=1)}\right) = \log\left(\frac{1-p_0}{p_1}\right) \quad (2)$$

In an example, if $p_0 = 0.1$ and $p_1 = 0.01$, then $\alpha_r = 10$, and LLRs from Eqns. (1) and (2) are computed as:

$l(1) = -2.3$ and $l(0) = 4.5$.

Herein, because $l(0) > l(1)$, the probability (or likelihood) that the actual bit being 0 given that a 0 was received is much greater than the probability of the actual bit being a 1 given that a 1 was received.

Embodiments of the disclosed provide modifications to LDPC decoding algorithms to leverage the fact that, in practice, bit errors in NAND pages and SSD applications are mostly asymmetric. The described embodiments provide, inter alia, the following:

A low-complexity asymmetric ratio estimator to estimate $\alpha_r$;

Modifications to a min-sum (MS) decoding algorithm for LDPC codes using the asymmetric ratio estimator; and An efficient hardware implementation for the modified MS decoding algorithm.

Simulation results illustrate that the modified MS decoding algorithm can improve performance by more than one order of magnitude.

Figure 8:
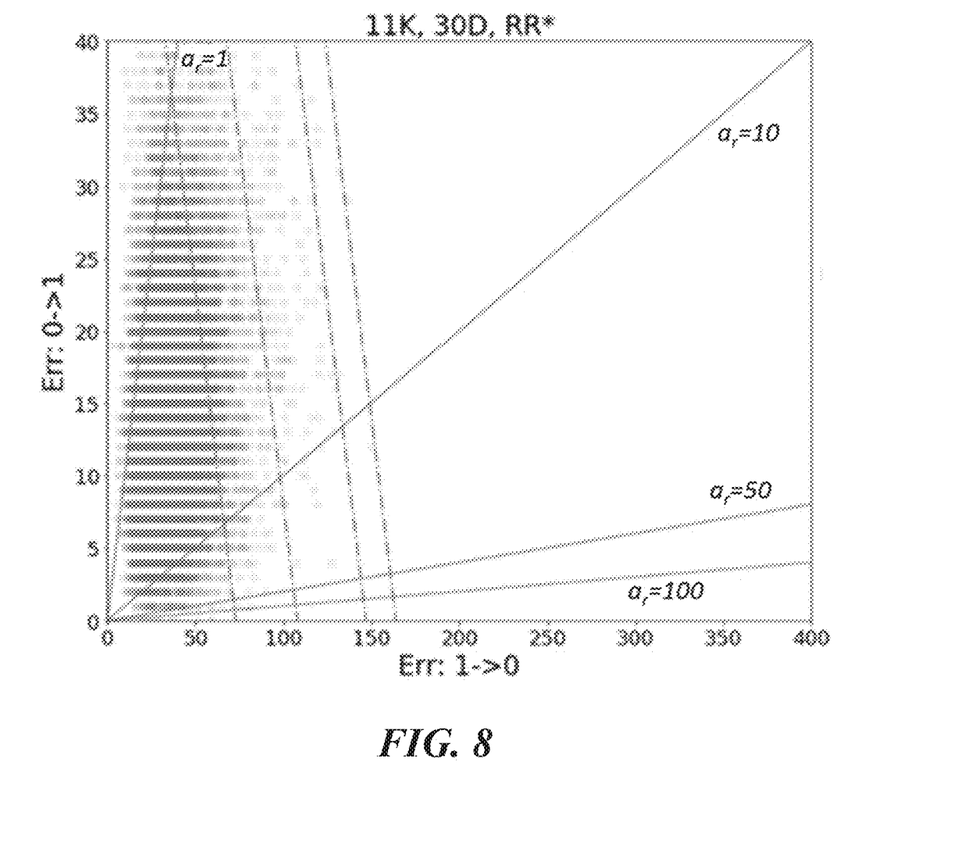
FIG. 8 illustrates an example of a NAND asymmetric ratio when a memory device is read at an optimal voltage threshold.

FIG. 8 illustrates an example of a number of $BER_{0 \to 1}$ errors (y-axis) and a number of $BER_{1 \to 0}$ errors (x-axis) for all pages of a NAND page at end-of-life conditions (PEC=11K, Ret=30D) when optimal read voltage thresholds (RR*) are used. As seen therein, most of the NAND pages have asymmetric ratios in the range $1 < \alpha_r < 10$.

Figure 9A:
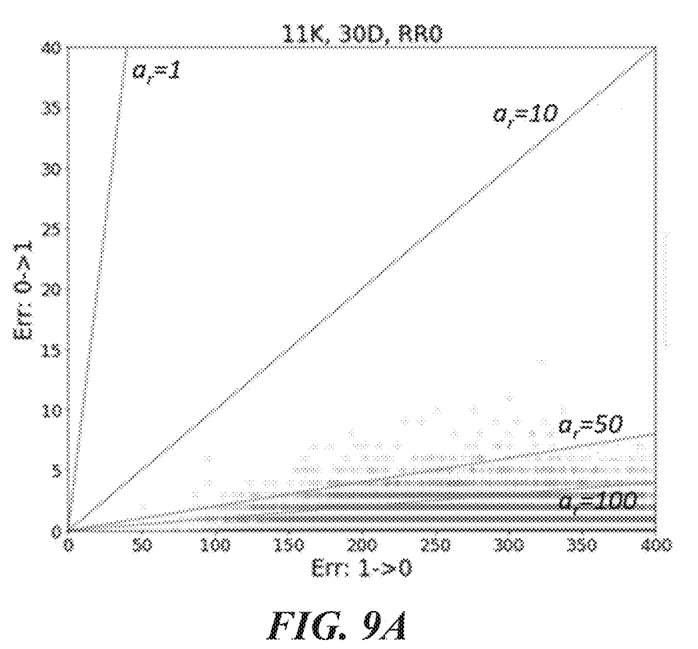
FIGS. 9A and 9B illustrate examples of NAND asymmetric ratios when a memory device is read at different imperfect voltage thresholds.
Figure 9B:
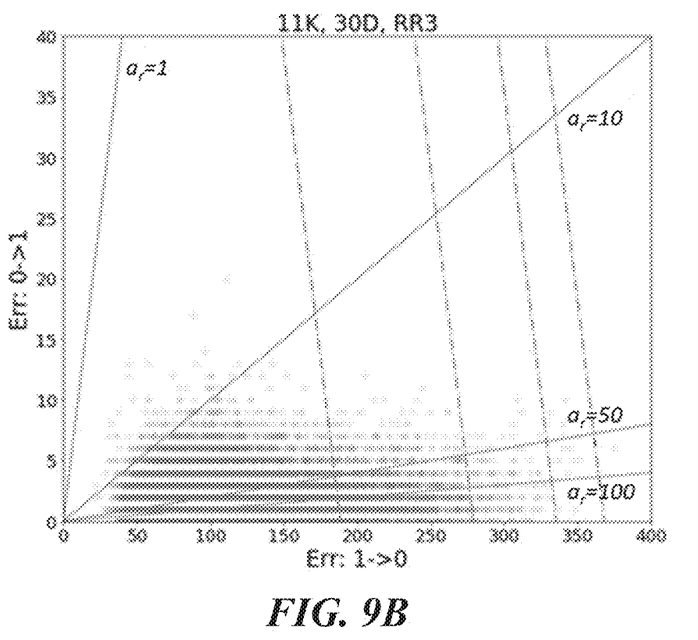

FIGS. 9A and 9B illustrate an example of the number of $BER_{0 \to 1}$ errors (y-axis) and the number of $BER_{1 \to 0}$ errors (x-axis) for all pages of a NAND page at end-of-life conditions (PEC=11K, Ret=30D) when imperfect (or suboptimal) voltage thresholds, e.g., history reads (and denoted $RR_0$ and $RR_3$ for FIGS. 8A and 8B, respectively), are used. As seen therein, most of the NAND pages have asymmetric ratios that are greater than 10, i.e., $\alpha_r > 10$.

Figure 10:
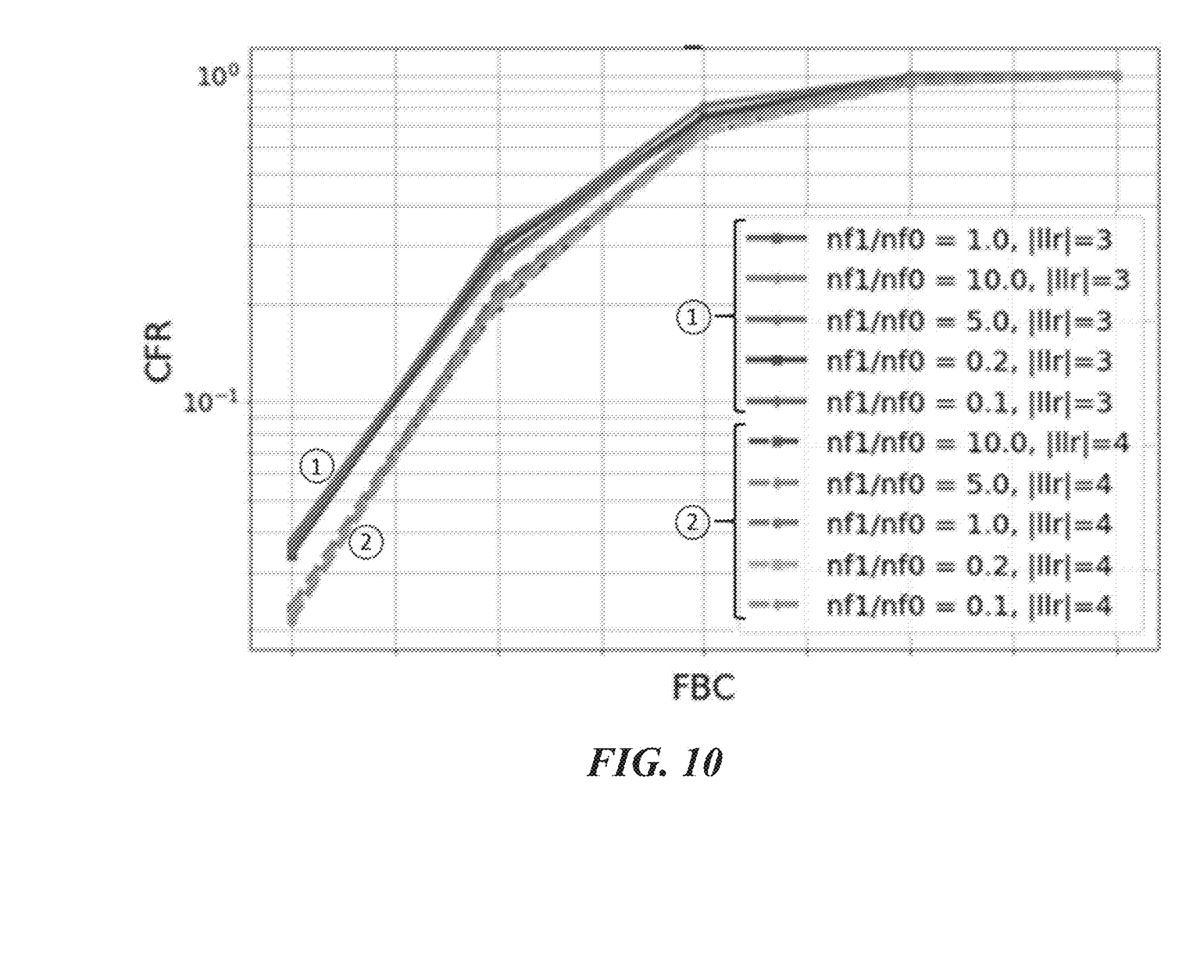
FIG. 10 illustrates the performance of an example blind decoder for different values of the asymmetric ratio.

Symmetric errors are typically the most difficult errors to correct when decoding any error correcting codes, including LDPC codes, and thus the LDPC decoder is designed under the assumption that the errors are symmetric, i.e., the worst-case scenario. FIG. 10 illustrates the performance of a blind min-sum LDPC decoder, wherein the code failure rate (CFR) is shown as a function of the failure bit count (FBC) for different asymmetric ratios, e.g., $0.1 < \alpha_r = nf1/nf0 \leq 10$. As shown therein, the decoder performance does not change in the presence of a high asymmetric ratio $\alpha_r$, which is the result of the log likelihood ratio (LLR) used for each received bit in the decoder being set to a symmetric value, e.g., llr=±3 or llr=±4.

Figure 11:
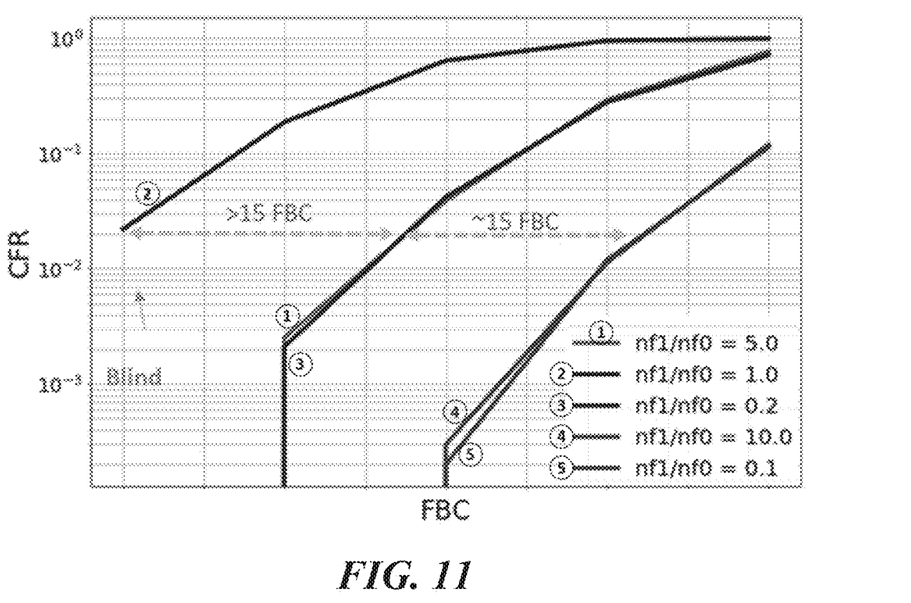
FIG. 11 illustrates the performance of an example decoder in a BAC, which compares known and unknown a priori probabilities.

FIG. 11 shows the CFR performance of existing min-sum hard decision algorithms if the channel LLRs (the input to the min-sum decoder) were selected optimally by considering the integer value of the computed LLRs (based on Eqns. (1) and (2)). In this example, it is assumed that the decoder knows the probabilities $p_0$ and $p_1$, i.e., the decoder is not blind to the switching probabilities (and is referred to as a non-blind decoder). As shown in FIG. 11, and compared to the performance of a blind decoder (denoted [2] in FIG. 11 that assumes symmetric errors), the CFR can be improved by more than 15 FBC when $\alpha_r = 5$ (denoted [1] in FIG. 11), and by more than 30 FBC when $\alpha_r = 10$ (denoted [4] in FIG. 11).

In some embodiments, the disclosed technology can be configured to efficiently estimate $\alpha_r$, and this estimator can be leveraged to obtain better channel LLRs that reflect the asymmetric ratio for the blind system.

In some embodiments, the channel LLR is estimated by dividing the total number of decoding iterations into several rounds such that each round contains multiple iterations. For example, if the total number of decoding iterations is 40, a division can result in 4 rounds with each round consisting of 10 iterations. The channel LLR for the received bit y at the beginning of round s is denoted $\hat{l}^s(y)$, a vector comprising the indexes corresponding to a specific received bit value is defined as $l(0)=\{i \in [1, n] | y_i = 0\}$ and $I(1)=\{i \in [1, n] | y_i = 1\}$, for a received bit value of "0" and "1," respectively, where n is the codeword length, and counters $C_{I(0)}^{(s)}$ and $C_{I(1)}^{(s)}$ are used to count the number of positions in a min-sum hard decision at the end of round s that are equal to 1 in I(0) and I(1), respectively. Based on this notation, the estimated channel LLR for round s+1 is determined as:

$$\hat{l}^{(s+1)}(0) = \ln\left(\frac{|I(0)| - C_{I(0)}^{(s)}}{C_{I(0)}^{(s)}} \times \frac{C_{I(0)}^{(s)} + C_{I(1)}^{(s)}}{n - C_{I(0)}^{(s)} - C_{I(1)}^{(s)}}\right) \quad (3)$$

and $$\hat{l}^{(s+1)}(1) = \ln\left(\frac{|I(1)| - C_{I(1)}^{(s)}}{C_{I(1)}^{(s)}} \times \frac{C_{I(0)}^{(s)} + C_{I(1)}^{(s)}}{n - C_{I(0)}^{(s)} - C_{I(1)}^{(s)}}\right) \quad (4)$$

In an example, it is assumed that $p_0 = \frac{1}{4}$, $p_1 = \frac{1}{6}$, and n=12, and the input (x) and output (y) of a binary asymmetric channel (BAC) are given as:

x=(1,1,1,1,1,1,0,0,0,0,0,0) and y=(0,1,1,1,1,1,0,0,0,0,1,1).

In this example, $I(0)=\{0,6,7,8,9\}$ and $I(1)=\{1,2,3,4,5,10,11\}$; here, I(0) indicates that the 0-th and 6-th through 9-th indexes of y are zero, and I(1) indicates that the 1-st through the 5-th, 10-th and 11-th indexes of y are one. It is further assumed that the original channel LLRs were selected using the symmetric assumption, which results in:

$l_{ch} = l^{(s=0)} = \{+3,-3,-3,-3,-3,-3,+3,+3,+3,+3,-3,-3\}$.

In this example, after round s of decoding, the hard decision after decoding (e.g., the sign of the sum of LLRs in each variable node) is assumed to be $\hat{y}^{(s)} = (1,1,1,0,1,1,0,0,0,1,0,1)$. Given this hard decision at the end of round s, the counters described above can be determined as $C_{I(0)}^{(s)} = \{1, 0, 0, 0, 1\}$ and $C_{I(1)}^{(s)} = \{1,1, 0,1, 1, 0, 1\}$, which enables the determination of the asymmetric channel LLRs as $$\hat{l}^{(s+1)}(0) = \ln\left(\frac{5-2}{2} \times \frac{2+5}{12-2-5}\right) = \ln\left(\frac{21}{10}\right)$$

$$\hat{l}^{(s+1)}(0) = \ln\left(\frac{7-5}{5} \times \frac{2+5}{12-2-5}\right) = \ln\left(\frac{14}{25}\right).$$

In this example, it is noted that memory is needed to store I(0), I(1), and a binary flag sequence of length n, as well as two counters for storing $C_{I(0)}^{(s)}$ and $C_{I(1)}^{(s)}$.

In some embodiments, a min-sum hard decision algorithm assumes the following notation: $I_{max}$ is the number of maximum iterations, $I_s$ is the number of iterations in each stage, $N_s = I_{max}/I_s$ is the number of stages, $d_j^{(s)}$ is the hard decision of variable node j at the end of s-th stage, and $d^{(s)} = [d_0^{(s)}, d_1^{(s)}, \ldots, d_{n-1}^{(s)}]$ is the hard decision of the candidate codeword at the end of s-th stage. It is further assumed that $d^{(-1)} = [d_0^{(-1)}, \ldots, d_{n-1}^{(-1)}] = y$ is the initial hard decision obtained from the received sequence y, $syn^{(i)} = [d_0^{(i)}, d_0^{(i)}, \ldots, d_{n-1}^{(i)}] \times H^T$ is the syndrome at each iteration i, and $cs^{(i)} = \|syn^{(i)}\|$ is the checksum. Herein, the min-sum hard decision algorithm includes the following operations (or steps):

---

Step 0. Set iter=0, calculate $syn^{(-1)}$ and go to step 1;

Step 1. Increment the iteration index, iter = iter + 1; if the maximum number of iteration have been reached, stop decoding. Otherwise, go to step 2;

Step 2. Set $l^{(s=-1)}(y)$ similar to symmetric channel assumption (or blind decoder);

-continued

```
Step 3. If cs^(iter) = 0, stop decoding. Otherwise, go to step 4;
Step 4. For 1 ≤ s ≤ N_s:
            For 1 ≤ i ≤ I_s:
                Perform MS message passing between
                    variable nodes and check nodes for
                    this iteration;
                Compute checksum cs^(iter);
                If i = = I_s:
                    Compute hard decision d^(s)
                    Compute channel llr for next stage as
                        l^(s+1)(y) using the
                        asymmetric ratio estimator
                        as described in Eqns. (3)
                        and (4)
                Increment i (i = i + 1);
            Increment s (s = s + 1)
```

In some embodiments, the number of stages and the maximum number of iterations are selected based on the parameters of the LDPC code being decoded. In an example, the parameters of the LDPC code include the codeword length, the code rate, and/or the sparsity of the parity check matrix of the LDPC code.

In some embodiments, the number of iterations in each of the number of stages is different. For example, if there are four rounds and the total number of iterations is 40, the number of iterations for the first, second, third, and fourth rounds could be 14, 12, 8, and 6, respectively (as compared to equally dividing the total number of iterations such that each of the four rounds has 10 iterations). Using an unequal number of iterations, e.g., a higher number of iterations in the earlier rounds, with asymmetric LLRs, may enable the LDPC decoder to converge in a fewer number of total iterations.

Figure 12:
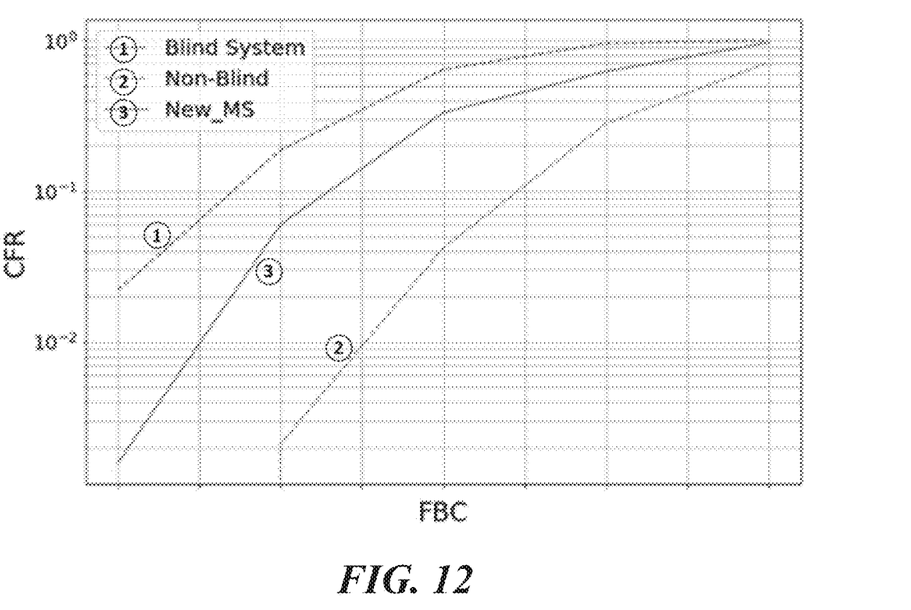
FIG. 12 illustrates the performance of an example embodiment described herein.

FIG. 12 illustrates the performance of an example min-sum algorithm (denoted [3]) compared to a blind decoder (denoted [1]) and an optimal non-blind decoder (denoted [2]).

Figure 13:
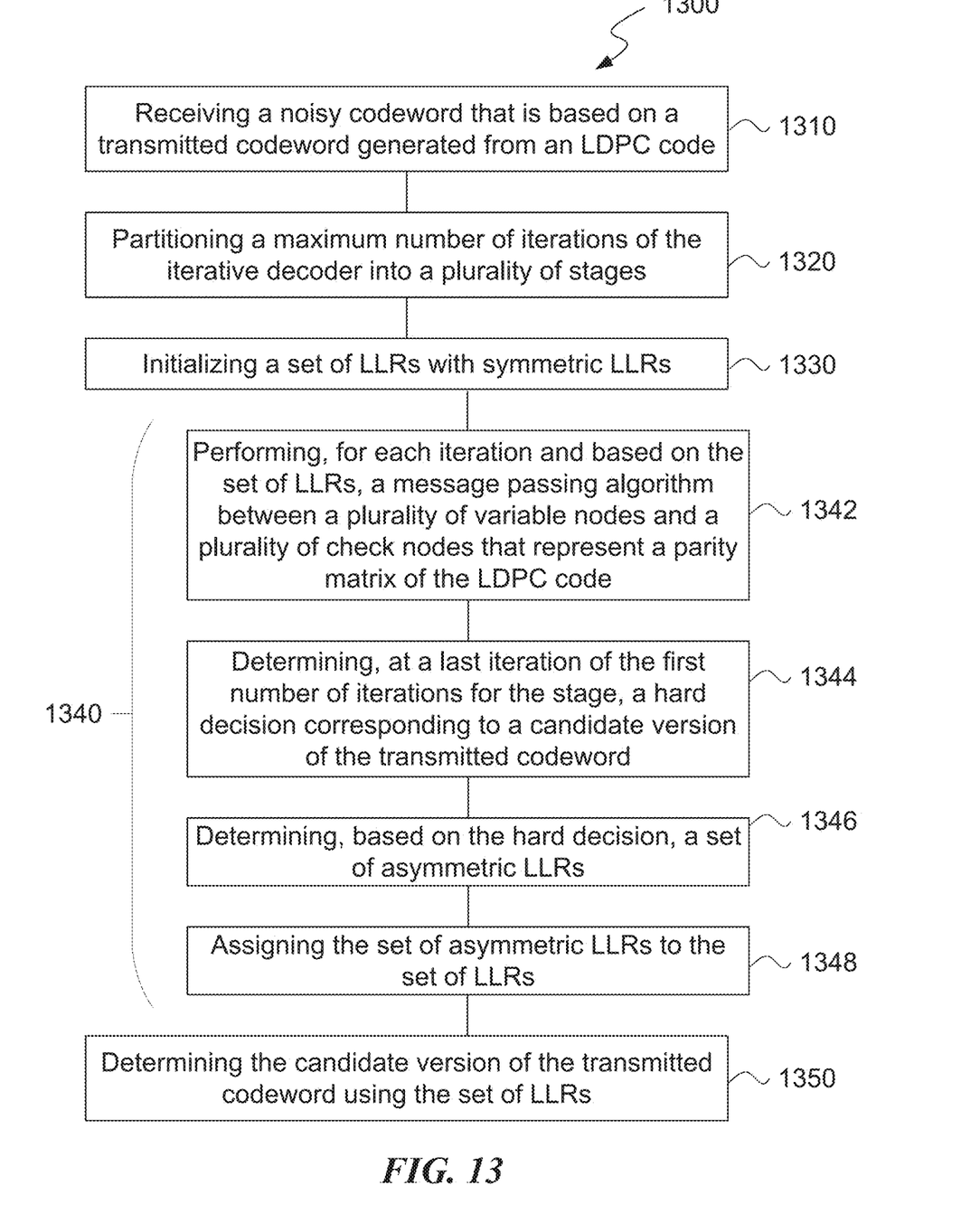
FIG. 13 illustrates a flowchart of an example method for improving the performance of a memory device.

FIG. 13 illustrates a flowchart of an example method 1300 for improving the performance of a memory device. The method 1300 includes, at operation 1310, receiving a noisy codeword that is based on a transmitted codeword generated from a low-density parity-check (LDPC) code.

The method 1300 includes, at operation 1320, partitioning a maximum number of iterations of the iterative decoder into a plurality of stages, each stage comprising a first number of iterations. In an example, the first number of iterations is constant for each of the plurality of stages. In another example, each stage may be configured with a different number of iterations.

The method 1300 includes, at operation 1330, initializing a set of log likelihood ratios (LLRs) with symmetric LLRs. In an example, the symmetric LLRs may be determined using Eqns. (1) and (2) with $p_0=p_1=0.5$.

The method 1300 includes, at operation 1340, performing a set of operations (denoted 1342-1348 in FIG. 13) for each stage of the plurality of stages.

The method at operation 1340, which is performed for each stage, includes at operation 1342, performing, for each iteration of the first number of iterations and based on the set of LLRs, a message passing algorithm between a plurality of variable nodes and a plurality of check nodes that represent a parity matrix of the LDPC code.

The method at operation 1340, which is performed for each stage, includes at operation 1344, determining, at a last iteration of the first number of iterations for the stage, a hard decision corresponding to a candidate version of the transmitted codeword.

The method at operation 1340, which is performed for each stage, includes at operation 1346, determining, based on the hard decision, a set of asymmetric LLRs.

The method at operation 1340, which is performed for each stage, includes at operation 1348, assigning the set of asymmetric LLRs to the set of LLRs.

The method 1300 includes, at operation 1350, determining the candidate version of the transmitted codeword using the set of LLRs.

In some embodiments, the message passing algorithm is a min-sum (MS) message passing algorithm. In other embodiments, the message passing algorithm is a sum-product message passing algorithm.

In some embodiments, the set of asymmetric LLRs comprises a first channel log-likelihood ratio (LLR) corresponding to a received bit being a zero at a beginning of a stage, and a second channel LLR corresponding to the received bit being a one at the beginning of the stage. In an example, the first channel LLR and the second channel LLR are based on the hard decision of the noisy codeword at an end of a stage of the plurality of stages. In another example, the first channel LLR is determined based on a length of the noisy codeword, a first set of indices corresponding to bits of the noisy codeword that are equal to zero, a second set of indices corresponding to bits of the noisy codeword that are equal to one, a first counter to accumulate a number of positions that are equal to one in the first set of indices, and a second counter to accumulate a number of positions that are equal to one in the second set of indices. In yet another example, the first channel LLR at a beginning of stage (s+1) is determined as:

$$l^{(s+1)}(0) = \ln\left(\frac{|I(0)| - C_{I(0)}^{(s)}}{C_{I(0)}^{(s)}} \times \frac{C_{I(0)}^{(s)} + C_{I(1)}^{(s)}}{n - C_{I(0)}^{(s)} - C_{I(1)}^{(s)}}\right).$$

Herein, s represents a stage, ln represents the natural logarithm function, $I(0)=\{i \in [1, n]\ y_i=0\}$ is a first set of indices $\{i\}$ for which a bit $y_i$ of the noisy codeword is equal to zero and $I(1)=\{i \in [1, n]\ |y_i=1\}$ is a second set of indices $\{i\}$ for which the bit $y_i$ of the noisy codeword is equal to one, n is an integer length of the noisy codeword, and $C_{I(0)}^{(s)}$ and $C_{I(1)}^{(s)}$ are a number of positions in the hard decision of the noisy codeword at an end of the stage s equal to 1 in I(0) and I(1), respectively.

In some embodiments, a number of the plurality of stages or the maximum number of iterations is based on one or more parameters of the LDPC code.

In some embodiments, the one or more parameters of the LDPC code comprises a sparsity of a parity check matrix of the LDPC code, a code rate of the LDPC code, or a length of the transmitted codeword.

In some embodiments, the method 1300 further includes, for each stage of the plurality of stages, the operations of computing, subsequent to performing the message passing algorithm, a checksum corresponding to the candidate version of the transmitted codeword, refraining from performing a subsequent iteration upon a determination that the checksum is equal to zero, and determining the hard decision for the candidate codeword.

Embodiments of the disclosed include an apparatus for improving performance of a memory device. The apparatus includes a processor and a memory including instructions stored thereupon, wherein the instructions upon execution by the processor cause the processor to: receive a noisy codeword that is based on a transmitted codeword generated from a low-density parity-check (LDPC) code; partition a maximum number of iterations of the iterative decoder into a plurality of stages, each stage comprising a first number of iterations; initialize a set of log likelihood ratios (LLRs) with symmetric LLRs; for each stage of the plurality of stages: perform, for each iteration of the first number of iterations and based on the set of LLRs, a message passing algorithm between a plurality of variable nodes and a plurality of check nodes that represent a parity matrix of the LDPC code, determine, at a last iteration of the first number of iterations for the stage, a hard decision corresponding to a candidate version of the transmitted codeword, determine, based on the hard decision, a set of asymmetric LLRs, and assign the set of asymmetric LLRs to the set of LLRs; and determine, using the set of LLRs, the candidate version of the transmitted codeword.

Figure 14:
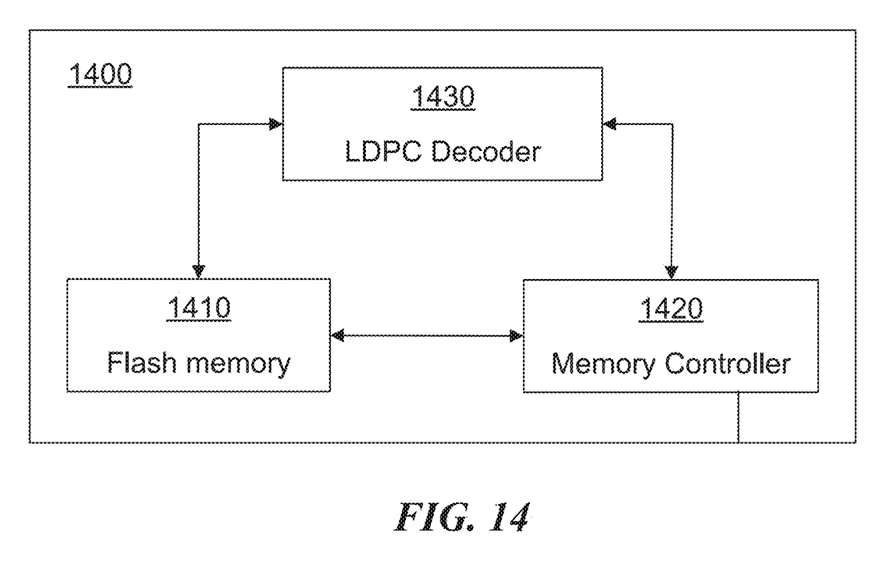
FIG. 14 is an example diagram illustrating a storage device that can be configured to implement the described embodiments.

FIG. 14 is an example diagram illustrating a storage device that can be configured to implement the described embodiments. Referring to FIG. 14, a data storage device 1400 may include a flash memory 1410, a memory controller 1420, and an LDPC decoder 1430. The memory controller 1420 may control the flash memory 1410 and the LDPC decoder 1430 in response to control signals input from the outside of the data storage device 1400. In the data storage device 1400, the flash memory 1410 may be configured the same or substantially the same as a nonvolatile memory device. That is, the flash memory 1410 may read data from selected memory cells using different read voltages to output it to the memory controller 1420.

In some embodiments, the data storage device 1400 may be a memory card device, an SSD device, a multimedia card device, an SD card, a memory stick device, an HDD device, a hybrid drive device, or an USB flash device. For example, the data storage device 1400 may be a card which satisfies the standard for user devices such as a digital camera, a personal computer, and so on.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving a performance of an iterative decoder in a non-volatile memory, comprising:
receiving a noisy codeword that is based on a transmitted codeword generated from a low-density parity-check (LDPC) code;
partitioning a maximum number of iterations of the iterative decoder into a plurality of stages, each stage comprising a first number of iterations;
initializing a set of log likelihood ratios (LLRs) with symmetric LLRs;
for each stage of the plurality of stages:
performing, for each iteration of the first number of iterations and based on the set of LLRs, a message passing algorithm between a plurality of variable nodes and a plurality of check nodes that represent a parity matrix of the LDPC code,
determining, at a last iteration of the first number of iterations for the stage, a hard decision corresponding to a candidate version of the transmitted codeword,
determining, based on the hard decision, a set of asymmetric LLRs, and
assigning the set of asymmetric LLRs to the set of LLRs; and
determining the candidate version of the transmitted codeword using the set of LLRs.

2. The method of claim 1, wherein the message passing algorithm is a min-sum message passing algorithm.

3. The method of claim 1, wherein the set of asymmetric LLRs comprises a first channel log-likelihood ratio (LLR) corresponding to a received bit being a zero at a beginning of a stage, and a second channel LLR corresponding to the received bit being a one at the beginning of the stage.

4. The method of claim 3, wherein the first channel LLR and the second channel LLR are based on the hard decision of the noisy codeword at an end of a stage of the plurality of stages.

5. The method of claim 4, wherein the first channel LLR is determined based on a length of the noisy codeword, a first set of indices corresponding to bits of the noisy codeword that are equal to zero, a second set of indices corresponding to bits of the noisy codeword that are equal to one, a first counter to accumulate a number of positions that are equal to one in the first set of indices, and a second counter to accumulate a number of positions that are equal to one in the second set of indices.

6. The method of claim 4, wherein the first channel LLR at a beginning of stage (s+1) is determined as:

$$\hat{l}^{(s+1)}(0) = \ln\left(\frac{|I(0)| - C_{I(0)}^{(s)}}{C_{I(0)}^{(s)}} \times \frac{C_{I(0)}^{(s)} + C_{I(1)}^{(s)}}{n - C_{I(0)}^{(s)} - C_{I(1)}^{(s)}}\right),$$

wherein:
s represents a stage,
ln represents the natural logarithm function,
$I(0)=\{i \in [1, n] | y_i=0\}$ is a first set of indices $\{i\}$ for which a bit $y_i$ of the noisy codeword is equal to zero and $I(1)=\{i \in [1, n] | y=1\}$ is a second set of indices $\{i\}$ for which the bit $y_i$ of the noisy codeword is equal to one,
n is an integer length of the noisy codeword, and $C_{I(0)}^{(s)}$ and $C_{I(1)}^{(s)}$ are a number of positions in the hard decision of the noisy codeword at an end of the stage s equal to 1 in I(0) and I(1), respectively.

7. The method of claim 1, wherein a number of the plurality of stages or the maximum number of iterations is based on one or more parameters of the LDPC code.

8. The method of claim 7, wherein the one or more parameters of the LDPC code comprises a sparsity of a parity check matrix of the LDPC code, a code rate of the LDPC code, or a length of the transmitted codeword.

9. The method of claim 1, wherein for each stage of the plurality of stages:
computing, subsequent to performing the message passing algorithm, a checksum corresponding to the candidate version of the transmitted codeword;
refraining from performing a subsequent iteration upon a determination that the checksum is equal to zero; and
determining the hard decision for the candidate codeword.

10. A system for improving a performance of an iterative decoder in a non-volatile memory, comprising:
a processor and a memory including instructions stored thereupon, wherein the instructions upon execution by the processor cause the processor to:
receive a noisy codeword that is based on a transmitted codeword generated from a low-density parity-check (LDPC) code;
partition a maximum number of iterations of the iterative decoder into a plurality of stages, each stage comprising a first number of iterations;
initialize a set of log likelihood ratios (LLRs) with symmetric LLRs;
for each stage of the plurality of stages:
perform, for each iteration of the first number of iterations and based on the set of LLRs, a message passing algorithm between a plurality of variable nodes and a plurality of check nodes that represent a parity matrix of the LDPC code,
determine, at a last iteration of the first number of iterations for the stage, a hard decision corresponding to a candidate version of the transmitted codeword,
determine, based on the hard decision, a set of asymmetric LLRs, and
assign the set of asymmetric LLRs to the set of LLRs; and
determine, using the set of LLRs, the candidate version of the transmitted codeword.

11. The system of claim 10, wherein the set of asymmetric LLRs comprises a first channel log-likelihood ratio (LLR) corresponding to a received bit being a zero at a beginning of a stage, and a second channel LLR corresponding to the received bit being a one at the beginning of the stage.

12. The system of claim 11, wherein the first channel LLR and the second channel LLR are based on the hard decision of the noisy codeword at an end of a stage of the plurality of stages.

13. The system of claim 12, wherein the first channel LLR is determined based on a length of the noisy codeword, a first set of indices corresponding to bits of the noisy codeword that are equal to zero, a second set of indices corresponding to bits of the noisy codeword that are equal to one, a first counter to accumulate a number of positions that are equal to one in the first set of indices, and a second counter to accumulate a number of positions that are equal to one in the second set of indices.

14. The system of claim 10, wherein a number of the plurality of stages or the maximum number of iterations is based on one or more parameters of the LDPC code.

15. The system of claim 14, wherein the one or more parameters of the LDPC code comprises a sparsity of a parity check matrix of the LDPC code, a code rate of the LDPC code, or a length of the transmitted codeword.

16. A non-transitory computer-readable storage medium having instructions stored thereupon for improving a performance of an iterative decoder in a non-volatile memory, comprising:

- instructions for receiving a noisy codeword that is based on a transmitted codeword generated from a low-density parity-check (LDPC) code;
- instructions for partitioning a maximum number of iterations of the iterative decoder into a plurality of stages, each stage comprising a first number of iterations;
- instructions for initializing a set of log likelihood ratios (LLRs) with symmetric LLRs;
- for each stage of the plurality of stages:
  - instructions for performing, for each iteration of the first number of iterations and based on the set of LLRs, a message passing algorithm between a plurality of variable nodes and a plurality of check nodes that represent a parity matrix of the LDPC code,
  - instructions for determining, at a last iteration of the first number of iterations for the stage, a hard decision corresponding to a candidate version of the transmitted codeword,
  - instructions for determining, based on the hard decision, a set of asymmetric LLRs, and
  - instructions for assigning the set of asymmetric LLRs to the set of LLRs; and
- instructions for determining the candidate version of the transmitted codeword using the set of LLRs.

17. The computer-readable storage medium of claim 16, wherein the message passing algorithm is a min-sum message passing algorithm.

18. The computer-readable storage medium of claim 16, wherein the set of asymmetric LLRs comprises a first channel log-likelihood ratio (LLR) corresponding to a received bit being a zero at a beginning of a stage, and a second channel LLR corresponding to the received bit being a one at the beginning of the stage.

19. The computer-readable storage medium of claim 18, wherein the first channel LLR and the second channel LLR are based on the hard decision of the noisy codeword at an end of a stage of the plurality of stages.

20. The computer-readable storage medium of claim 19, wherein the first channel LLR is determined based on a length of the noisy codeword, a first set of indices corresponding to bits of the noisy codeword that are equal to zero, a second set of indices corresponding to bits of the noisy codeword that are equal to one, a first counter to accumulate a number of positions that are equal to one in the first set of indices, and a second counter to accumulate a number of positions that are equal to one in the second set of indices.

* * * * *